United States Patent
Yamaguchi et al.

(10) Patent No.: US 7,359,253 B2
(45) Date of Patent: Apr. 15, 2008

(54) SEMICONDUCTOR MEMORY DEVICE WITH INPUT BUFFER

(75) Inventors: Shusaku Yamaguchi, Kawasaki (JP); Hiroyoshi Tomita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 113 days.

(21) Appl. No.: 11/012,148

(22) Filed: Dec. 16, 2004

(65) Prior Publication Data

US 2006/0044879 A1    Mar. 2, 2006

(30) Foreign Application Priority Data

Aug. 30, 2004    (JP) .............................. 2004-250631

(51) Int. Cl.
*G11C 7/00*    (2006.01)
(52) U.S. Cl. ............. 365/189.05; 365/194; 365/230.03
(58) Field of Classification Search ........... 365/189.05, 365/194, 230.03
See application file for complete search history.

(56) References Cited

U.S. PATENT DOCUMENTS

| 5,930,194 | A | * | 7/1999 | Yamagata et al. ..... 365/230.03 |
| 6,166,990 | A | * | 12/2000 | Ooishi et al. ............... 365/233 |
| 6,230,280 | B1 | * | 5/2001 | Okasaka ..................... 713/400 |
| 6,343,036 | B1 | * | 1/2002 | Park et al. .................. 365/193 |
| 6,438,667 | B1 | * | 8/2002 | Shinozaki ................... 711/163 |
| 6,466,492 | B2 |  | 10/2002 | Ikeda |
| 6,789,137 | B2 | * | 9/2004 | Itoh ............................ 710/14 |

FOREIGN PATENT DOCUMENTS

JP    09320258 A    12/1997

\* cited by examiner

*Primary Examiner*—Hoai V. Ho
(74) *Attorney, Agent, or Firm*—Arent Fox LLP

(57) ABSTRACT

A semiconductor memory device that includes an input buffer being inputted a write data from outside to buffer the write data and a control circuit putting the input buffer into an inactive state during a read operation and putting the input buffer into an active state when a read mask signal is inputted thereafter is provided.

6 Claims, 7 Drawing Sheets

SEMICONDUCTOR MEMORY DEVICE WITH INPUT BUFFER

CROSS-REFERENCE TO RELATED APPLICATIONS

This application is based upon and claims the benefit of priority from the prior Japanese Patent Application No. 2004-250631, filed on Aug. 30, 2004, the entire contents of which are incorporated herein by reference.

BACKGROUND OF THE INVENTION

1. Field of the Invention

The present invention relates to a semiconductor memory device.

2. Description of the Related Art

In Japanese Patent Application Laid-Open No. Hei 9-320258 (Patent Document 1), there is disclosed a SDRAM that includes plural data mask signal terminals provided to correspond to data input and output terminals, and input control circuits and output control circuits capable of controlling data input and output from the corresponding data input and output terminals in response to the logic of signals given to individual data mask signal terminals from outside.

In the U.S. Pat. No. 6,466,492 (Japanese Patent Application Laid-Open No. 2002-74952) (Patent Document 2), there is disclosed a semiconductor memory device in which an input buffer is activated/inactivated by a synchronizing mask control signal when it is in an active state.

SUMMARY OF THE INVENTION

It is an object of the present invention to provide a low-current-consumption semiconductor memory device.

According to one aspect of the present invention, a semiconductor memory device that includes an input buffer being inputted a write data from outside to buffer the write data and a control circuit putting the input buffer into an inactive state during a read operation and putting the input buffer into an active state when a read data mask signal is inputted thereafter is provided.

According to another aspect of the present invention, a semiconductor memory device that includes a control circuit putting a clock signal for latch into an inactive state during a read operation and putting the clock signal for latch into an active state when a read data mask signal is inputted thereafter and a latch circuit to latch a write data inputted from outside in synchronization with the clock signal for latch is provided.

DETAILED DESCRIPTION OF THE PREFERRED EMBODIMENTS

Figure 1:
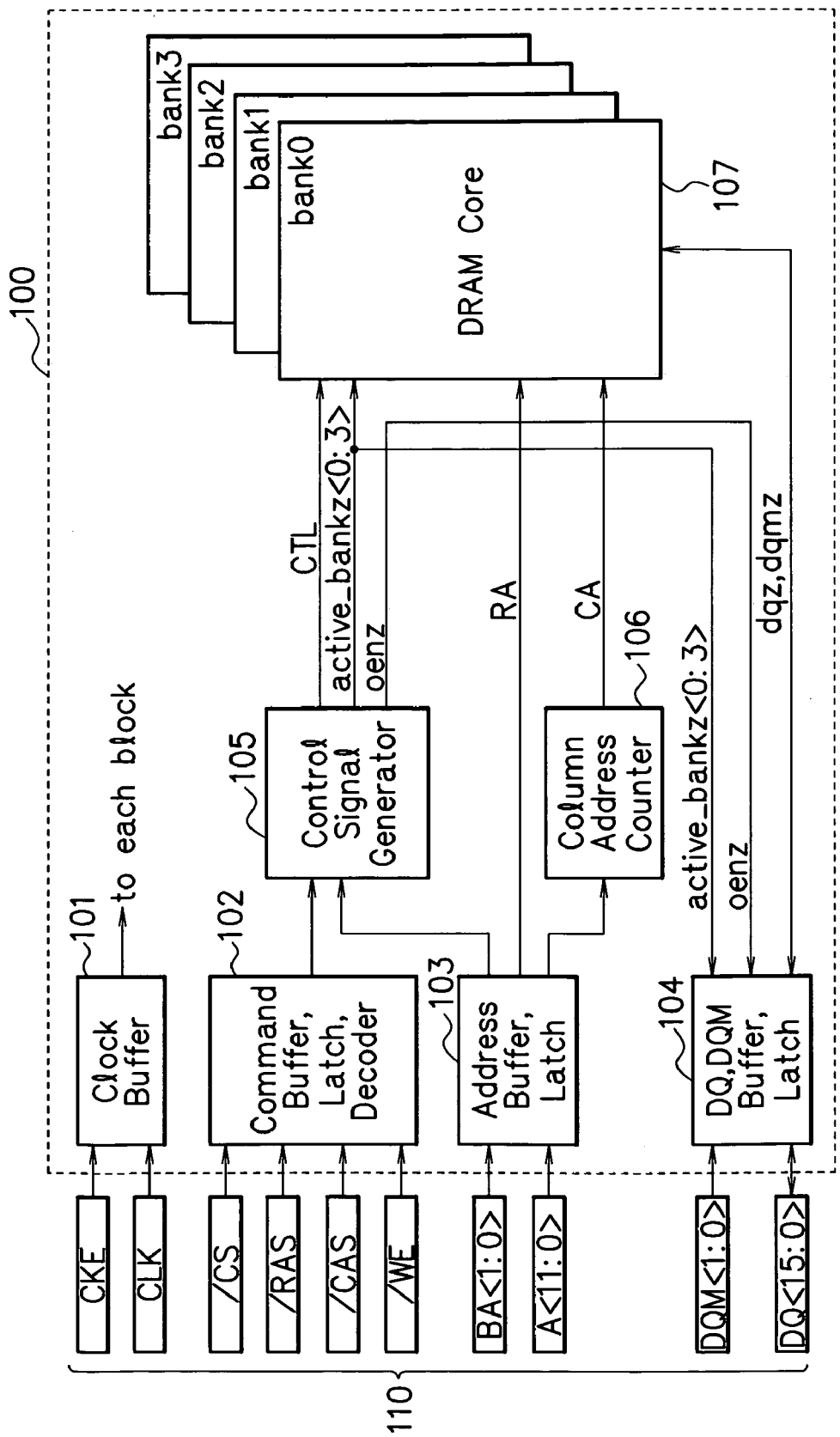
FIG. 1 is a block diagram showing a configuration example of a semiconductor memory device according to one embodiment of the present invention.

FIG. 1 is a block diagram showing a configuration example of a semiconductor memory device according to the present invention. Descriptions will be given by citing a SDRAM (Synchronous Dynamic Random Access Memory) as one example of the semiconductor memory device.

A semiconductor memory device 100 has, as outside terminals 110, respective terminals for a clock enable signal CKE, a clock signal CLK, a chip select signal /CS, a row address strobe signal /RAS, a column address strobe signal /CAS, a write enable signal /WE, a two bits of bank address BA, a 12 bits of address A, a two bits of data mask signal DQM, and a 16 bits of data DQ.

A crock buffer 101 is inputted the clock enable signal CKE and the clock signal CLK, and buffers and outputs the clock signal CLK to each of other circuit blocks. A circuit 102 includes a command buffer, a latch, and a decoder; and is inputted the chip select signal /CS, the row address strobe signal /RAS, the column address strobe signal /CAS, and the write enable signal /WE, and buffers, latches, and decodes these signals. With the combination of these signals being decoded, a command can be obtained. The command includes, for example, an active command, a precharge command, a read command, a write command, and the like. The command is outputted to a control signal generator 105.

A circuit 103 includes an address buffer and a latch, buffers and latches the bank address BA and the address A, and then outputs them to the control signal generator 105, a DRAM core 107, and a column address counter 106. The column address counter 106 increments the column address inputted from the bit line 103 in order and outputs a column address CA to the DRAM core 107. The control signal generator 105 generates and outputs a control signal CTL, a four bits of active bank signal "active_bankz", and an output enable signal "oenz".

A circuit 104 that includes a buffer and a latch is inputted the active bank signal "active_bankz" and the output enable signal "oenz", and buffers and latches the data DQ and the data mask signal DQM to output a data "dqz" and a data mask signal "dqmz" to the DRAM core 107. The circuit 104 will be detailed hereinafter with reference to FIG. 2. The terminal for the data DQ is a terminal being inputted a write data from outside to output a read data outside.

The DRAM core 107 is a memory cell array having for example four banks "bank 0" to "bank 3"; and is inputted the control signal CTL, the active bank signal "active_bankz", a row address RA, the column address CA, and the data mask signal "dqmz", and inputs and outputs the data "dqz".

Figure 2:
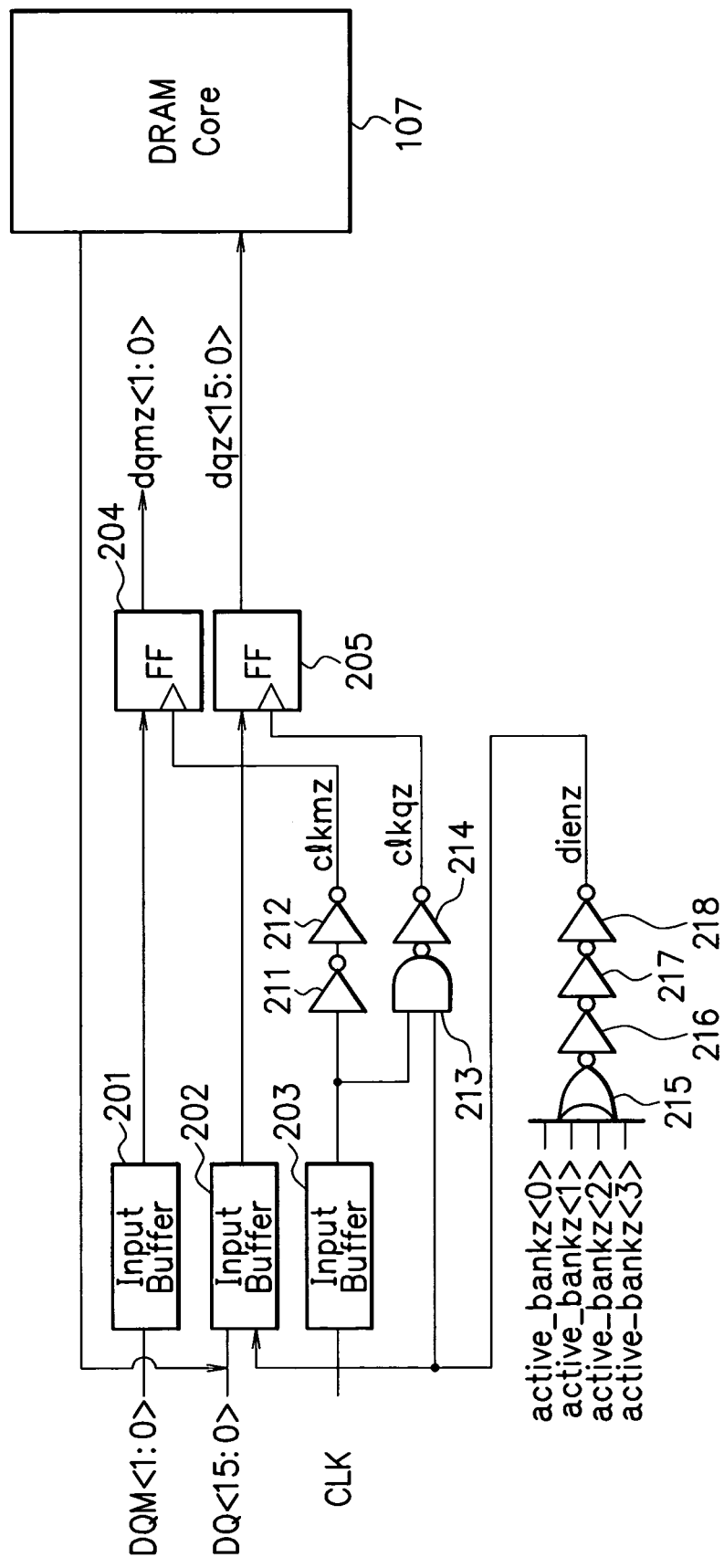
FIG. 2 is a circuit diagram showing a configuration example of a circuit 104 in FIG. 1.

FIG. 2 is a circuit diagram showing a configuration example of the circuit 104 in FIG. 1. An input buffer 201 is inputted the two bits of data mask signal DQM from outside, and buffers and outputs the same to a flip-flop 204. An input buffer 202 is inputted the 16 bits of write data DQ from outside, and buffers and outputs the same to a flip-flop 205. The input buffer 203 is inputted the clock signal CLK from outside, and buffers and outputs the same.

Inverters 211, 212 configure a buffer to amplify an output signal of an input buffer 203 and output a clock signal "clkmz".

A negative logical sum (NOR) circuit 215 and three inverters 216 to 218 configure a logical sum (OR) circuit. The NOR circuit 215 is inputted four bits of four active bank signals "active-bankz <0>" to "active-bankz <3>". An output signal "dienz" of the inverter 218 is an OR signal of the four bits of active bank signals "active-bankz <0>" to "active-bankz <3>".

A negative AND (NAND) circuit 213 and an inverter 214 configure a logical multiplication (AND) circuit. The NAND circuit 213 is inputted the output signal of the input buffer 203 and the signal "dienz". An output signal "clkqz" of the inverter 214 is an AND signal of the output signal of the input buffer 203 and the signal "dienz".

The signal "dienz" indicates an active state when it is at high level and an inactive state when it is at low level. When the output signal "dienz" is at high level, the clock signal "clkqz" comes to be the same signal as the output signal of the input buffer 203. When the signal "dienz" is at low level, the clock signal "clkqz" remains to be at low level to be halted.

Further, when the activation signal "dienz" is at high level, the input buffer 202 comes into an active state to buffer the write data DQ, but when the activation signal is at low level, the input buffer 202 comes into an inactive state not to buffer the write data DQ. Accordingly, by putting the input buffer 202 into an inactive state, current consumption (power consumption) can be reduced.

The flip-flop (latch circuit) 204 latches the two bits of data mask signal DQM outputted by the input buffer 201 in synchronization with the rising output signal "dienz" to output the two bits of data mask signal "dqmz".

The flip-flop 205 (latch circuit) latches the 16 bits of write data DQ outputted by the input buffer 202 in synchronization with the rising clock signal "clkqz" to output the 16 bits of write data "dqz". The write data "dqz" is written into the DRAM core 107. When the clock signal "clkqz" is halted, the flip-flop 205 does not operate, so that current consumption can be reduced.

A read data read out from the DRAM core 107 is outputted to the terminal for the data DQ without passing through the input buffer 202 and the flip-flop 205. The input buffer 202 and the flip-flop 205 are not used in the read operation but used only in the write operation. Accordingly, preferably, in the write operation, the activation signal "dienz" is brought into high level to put the input buffer 202 and the flip-flop 205 into an active state, and in the read operation, the activation signal "dienz" is brought into low level to put the input buffer 202 and the flip-flop 205 into an inactive state. Backed by this, current consumption can be reduced.

However, practically, it is difficult to put them into an inactive state in the read operation. Therefore, as shown in FIG. 2, when all of the active bank signals "active_bankz <0>" to "active_bankz <3>" are in an inactive state (precharge state), the signal "dienz" is brought into low level to thereby put the input buffer 202 and flip-flop 205 into an inactive state. In other words, the input buffer 202 and the flip-flop 205 are in an active state at the read and write operation. The reason thereof will be described hereinbelow with reference to FIG. 3 and FIG. 4.

The active signal "active_bankz <0>" is an active state signal of the bank "bank 0", and comes into high level by an active command and comes into low level by a precharge command. When inputting the active command and the precharge command, the bank address BA is set to 0 (zero). After the bank "bank 0" is put into an active state, the read operation by the read command or the write operation by the write command is enabled. Similarly, the active bank signals "active_bankz <1>" to "active_bankz <3>" are the active state signals of the banks "bank 1" to "bank 3".

Figure 3:
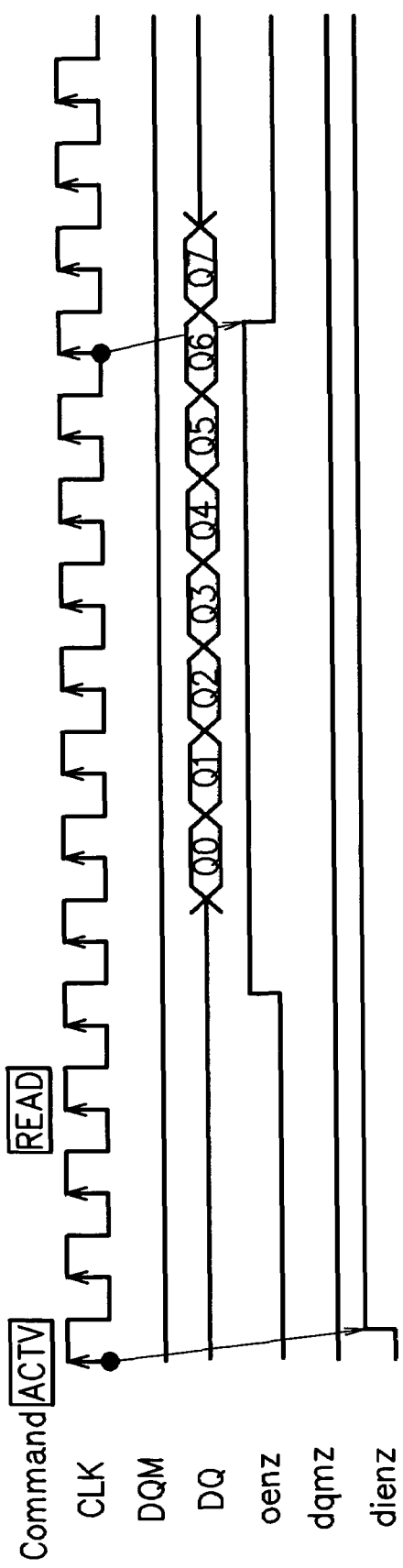
FIG. 3 is a timing chart showing an example of a read operation of the circuit in FIG. 2.

FIG. 3 is a timing chart showing a read operation example of the circuit in FIG. 2. When conducting a read operation, an active command ACTV is inputted from outside, and a read command READ is inputted thereafter.

The active command ACTV is inputted from outside together with the bank address BA and the address (row address) A. Backed by this, the active bank signal "active_bankz" corresponding to the bank address BA comes to high level to put the bank into an active state. For instance, when the bank address BA is 0 (zero), then the active bank signal "active_bankz <0>" comes to high level to put the bank "bank 0" into an active state. Accordingly, the activation signal "dienz" comes to high level to put the input buffer 202 and the clock signal for latch "clkqz" into an active state.

Note that, before inputting the active command ACTV, all of the active bank signals "active_bankz <0>" to "active_bankz <3>" are at low level, the activation signal "dienz" is at low level, and the input buffer 202 and the clock signal for latch "clkqz" (flip-flop 205) are in an inactive state.

Subsequently, the read command READ is inputted from outside together with the bank address BA and the address (column address) A. For instance, when the bank address BA is set to 0 (zero), in the bank "bank 0" being in an active state caused by the active command ACTV, it is possible to read out data Q0 to Q7 from the row address and the column address of the DRAM core 107 that are designated by the active command ACTV and the read command READ. A burst length is for example eight, and a burst read is conducted for eight data of consecutive addresses.

An output enable signal "oenz" comes to high level when outputting data at the following clock, and comes to low level when putting the terminal of the data DQ into a high-impedance state at the following clock.

The two bits of data mask signals DQM remains to be at low level in both the cases in normal read operation. Accordingly, the data mask signal "dqmz" also remains to be at low level.

As described above, when all the active bank signals "active_bankz <0>" to "active_bankz <3>" are at low level, the activation signal "dienz" stays at low level, so that the input buffer 202 and the clock signal for latch "clkqz" (flip-flop 205) come into an inactive state. When at least one active bank signal "active_bankz" is brought into high level by the active command ACTV, the activation signal "dienz" comes to high level to put the input buffer 202 and the clock signal for latch "clkqz" (flip-flop 205) into an active state.

Figure 4:
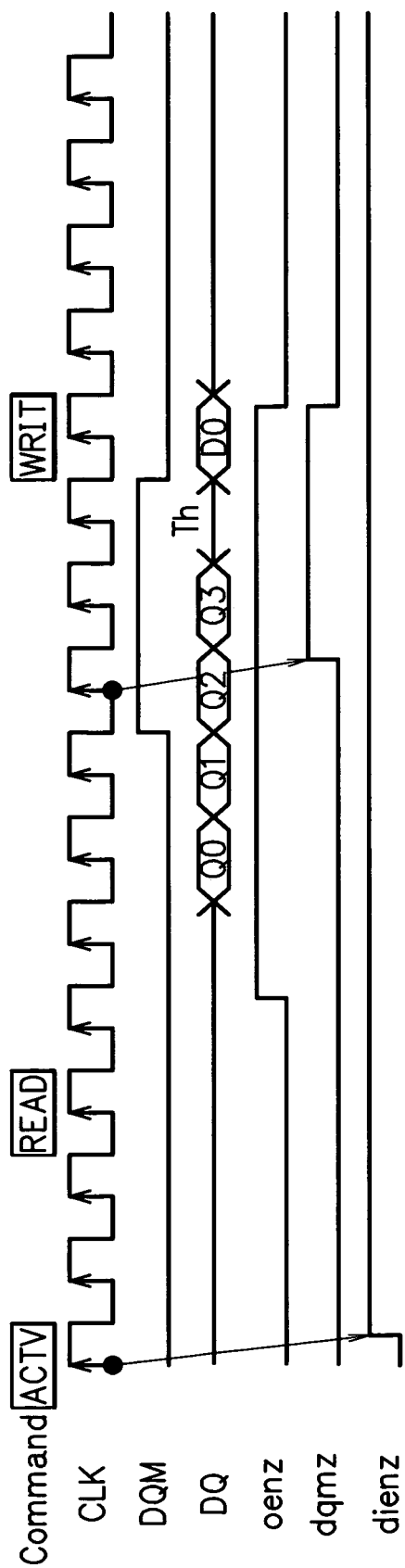
FIG. 4 is a timing chart showing an example of a writeinterrupt operation during a burst read of the circuit in FIG. 2.

FIG. 4 is a timing chart showing an example of a write interrupt operation during the burst read of the circuit in FIG. 2. For conducting this operation, the active command ACTV is inputted from outside, the read command READ is inputted thereafter, and after that, a write command WRIT is inputted.

Until a data Q1 is read out, the description is the same as the above description for FIG. 3. After that, the two bits of data mask signal DQM is put into high level in both the cases to generate a high-impedance period Th. In order to write a data D0 by the write command WRIT after reading data Q0 to Q3 out by the read command READ, the terminal for the data DQ needs to be brought into a high-impedance state in the period Th therebetween. Backed by this, at a single data DQ terminal, the switching from data output to data input is enabled, so that the contention caused by the input data and the output data can be prevented.

The flip-flop 204 latches the data mask signal DQM in synchronization with the rising clock signal CLK to output the data mask signal "dqmz". When the data mask signal "dqmz" comes into high level, the data Q3 is read out at the following clock, and the terminal for the data DQ comes into a high-impedance state thereafter.

Note that, in the case of the write operation, the two bits of data mask signal DQM is used to mask an upper byte or a lower byte to thereby write a write data.

Under normal conditions, with the read command READ, a burst read is conducted to eight data, however, there is sometimes a case where the data mask signal DQM is brought into high level to thereby input the write command WRIT in the course of the read operation. The write command WRIT is inputted from outside together with the write data D0 (DQ), the bank address BA, and the address (column address) A. For instance, when the bank address BA is set to 0 (zero), in the bank 0 being in an active state caused by the active command ACTV, it is possible to write the data D0 into the row address and the column address of the DRAM core 107 that are designated by the active command ACTV and the write command WRIT.

As described above, in the course of the read operation by the read command READ, the write command WRIT is inputted sometimes. In the write operation by the write command WRIT, the input buffer 202 and the flip-flop 205 are used. Therefore, there may be a case where the operation is switched to the write operation even in the mid-course of the read operation, so that the input buffer 202 and the clock signal for latch "clkqz" (flip-flop 205) need to be in an active state. Specifically, the write data D0 is inputted together with the write command WRIT, thereby the input buffer 202 and the clock signal for latch "clkqz" (flip-flop 205) need to be in an active state in advance in the read operation before the write command WRIT is inputted. For the reason as described above, the input buffer 202 and the clock signal for latch "clkqz" (flip-flop 205) are required to be in an active state even in the normal read operation in FIG. 3.

For the purpose of supporting the write interrupt operation during the burst read, the input buffer 202 and the clock signal for latch "clkqz" (flip-flop 205) are put into an active state even though they are not necessary to be activated during the normal read operation, so that the SDRAM consumes current-wastefully in the read operation, disturbing to lower current consumption. Notwithstanding the above, should the write interrupt operation during the burst read be prohibited or should the specification be modified to input the write data D0 in retard of the input of the write command WRIT, the existing design assets such as of a SDRAM controller becomes unavailable to finally increase burden on system designers.

Subsequently, a method that brings a solution to the above-described problems and that reduces current consumption, where the input buffer 202 and the clock signal for latch "clkqz" (flip-flop 205) are put into an inactive state in the mid-course of the read operation without modifying an operation specification, will be described with reference to FIG. 5 to FIG. 7.

Figure 5:
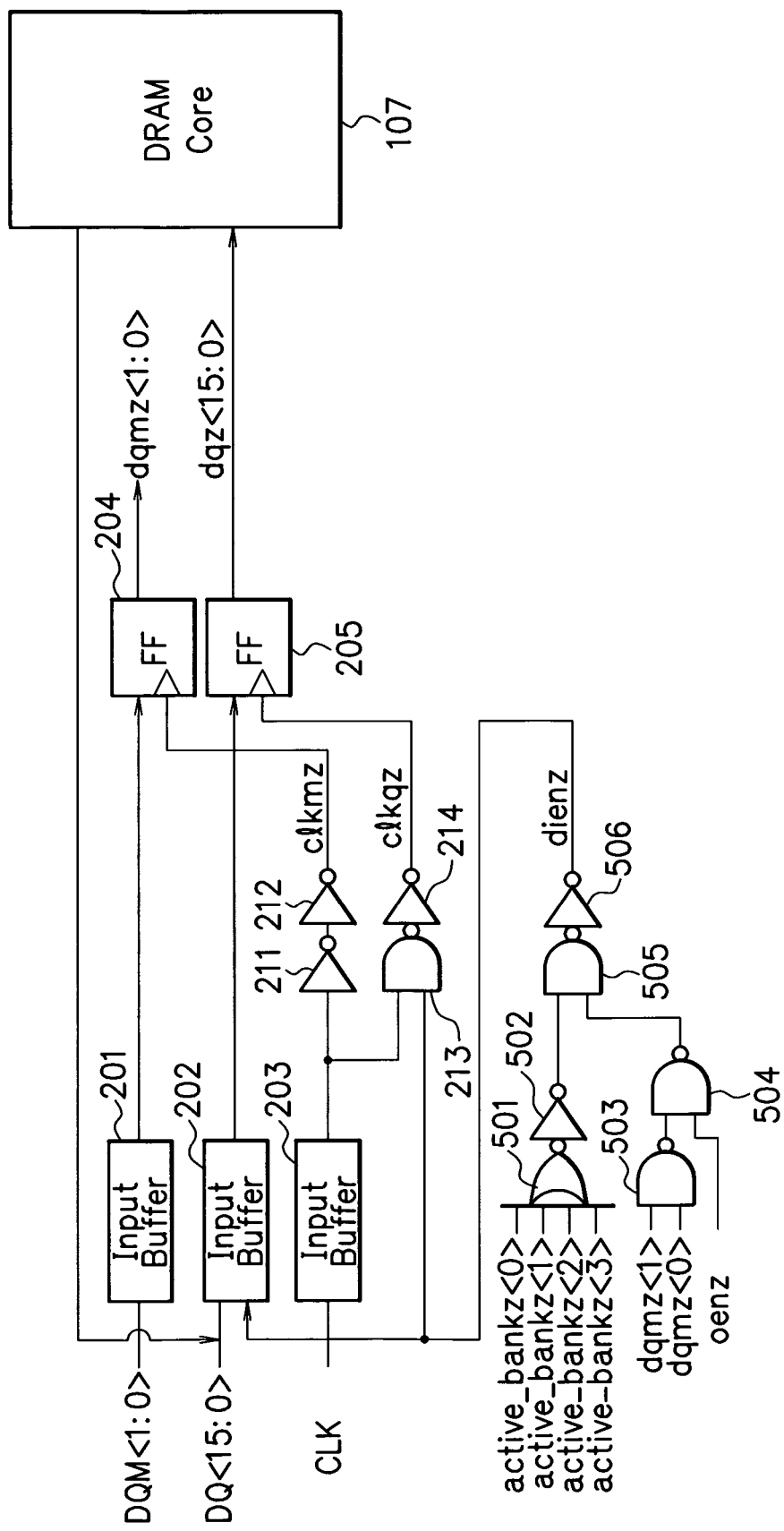
FIG. 5 is a circuit diagram showing a configuration example of a circuit 104 in FIG. 1 according to one embodiment of the present invention.

FIG. 5 is a circuit diagram showing a configuration example of the circuit 104 in FIG. 1 according to one embodiment of the present invention. FIG. 5 and FIG. 2 are the same other than the circuit to generate an activation signal "dienz".

A NOR circuit 501 and an inverter 502 configure an OR circuit. The NOR circuit 501 is inputted active bank signals "active_bankz <0>" to "active_bankz <3>". The output signals of the inverter 502 are OR signals of the active bank signals "active_bankz <0>" to "active_bankz <3>".

A NAND circuit 503 is inputted "dqmz <0>" and "dqmz <1>" outputted from the flip-flop 204 to output their NAND signal. A NAND circuit 504 is inputted the output signal of the NAND circuit 503 and an output enable signal "oenz" to output their NAND signal.

A NAND circuit 505 and an inverter 506 configure an AND circuit. The NAND circuit 505 is inputted the output signals of the inverter 502 and the NAND circuit 504. The activation signal "dienz" outputted from the inverter 506 is an AND signal of the output signals of the inverter 502 and the NAND circuit 504.

Specifically, when at least one of the active bank signals "active_bankz <0>" to "active_bankz <3>" is at high level, neither the data mask signal "dqmz <0>" nor the data mask signal "dqmz <1>" is at high level, and the output enable signal "oenz" is at high level, then the activation signal "dienz" comes into low level. Also, the activation signal "dienz" comes into low level when all the active bank signals "active_bankz <0>" to "active_bankz <3>" are at low level. In other cases, the activation signal "dienz" comes into high level.

When the activation signal comes into high level, the input buffer 202 and the clock signal for latch "clkqz" (flip-flop 205) come into an active state. When the activation signal "dienz"-comes into low level, the input buffer 202 and the clock signal for latch "clkqz" (flip-flop 205) come into an inactive state, so that current consumption can be reduced.

Figure 6:
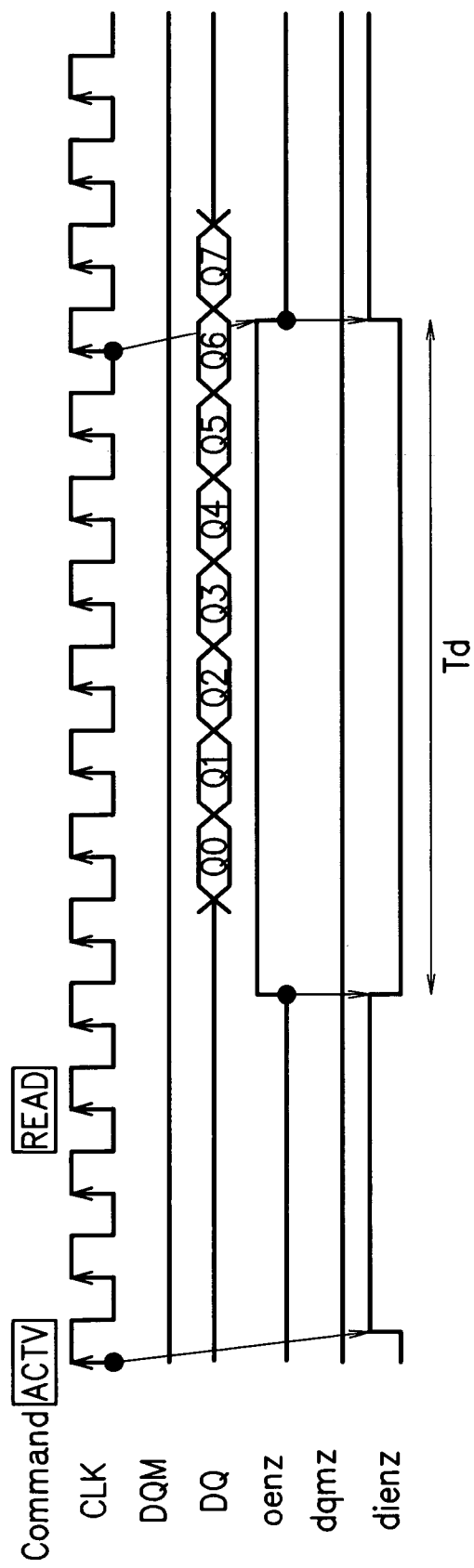
FIG. 6 is a timing chart showing an example of a read operation of the circuit in FIG. 5.

FIG. 6 is a timing chart showing an example of a read operation of the circuit in FIG. 5. When conducting the read operation, the active command ACTV is inputted from outside, and the read command READ is inputted thereafter. The description for the command, the clock signal CKL, the data mask signal DQM, the data DQ, an output enable signal "oenz", and the data mask signal "dqmz" is the same as of aforementioned FIG. 3. Hereinbelow, the description will be given for the activation signal "dienz".

Before being inputted the active command ACTV, active bank signals "active_bankz <0>" to "active_bankz <3>" are all at low level, so that the activation signal "dienz" comes into low level. Backed by this, the input buffer 202 and the clock signal for latch "clkqz" (flip-flop 205) come into an inactive state, so that current consumption can be reduced.

Next, the active command ACTV is inputted from outside together with the bank address BA, then the active bank signal "active_bankz" corresponding to the bank address BA comes into high level, and since the output enable signal "oenz" is at low level as well, the activation signal "dienz" comes into high level.

Subsequently, when the read command READ is inputted, as in the case of the above-described FIG. 3, the output enable signal "oenz" comes into high level. Then, both the data mask signals "dqmz <0>" and "dqmz <1>" are at low level. Accordingly, in a read period Td, the activation signal "dienz" comes into low level. In the read operation, the input buffer 202 and the flip-flop 205 are unnecessary, so that current consumption can be reduced by putting the input buffer 202 and the clock signal for latch "clkqz" (flip-flop 205) into an inactive state.

When a data Q6 is read out thereafter, the output enable signal "oenz" comes into low level. Then, the activation signal "dienz" comes into high level. After a data Q7 being the last data is read out, the terminal for the data DQ comes into a high-impedance state. The input buffer 202 and the clock signal for latch "clkqz" (flip-flop 205) come into an active state, so that preparation for the following write operation can be made.

As described above, in the read period Td, the input buffer 202 and the clock signal for latch "clkqz" (flip-flop 205) can be put into an inactive state, so that current consumption can be reduced.

Note that, by inputting a precharge command from outside together with the bank address BA, the active bank signal "active_bankz" corresponding to the bank address BA can be brought into low level. When all the active bank signals "active_bankz <0>" to "active_bankz <3>" are put into low level, the activation signal "dienz" comes into low level, so that the input buffer 202 and the clock signal for latch "clkqz" (flip-flop 205) can be put into an inactive state.

Figure 7:
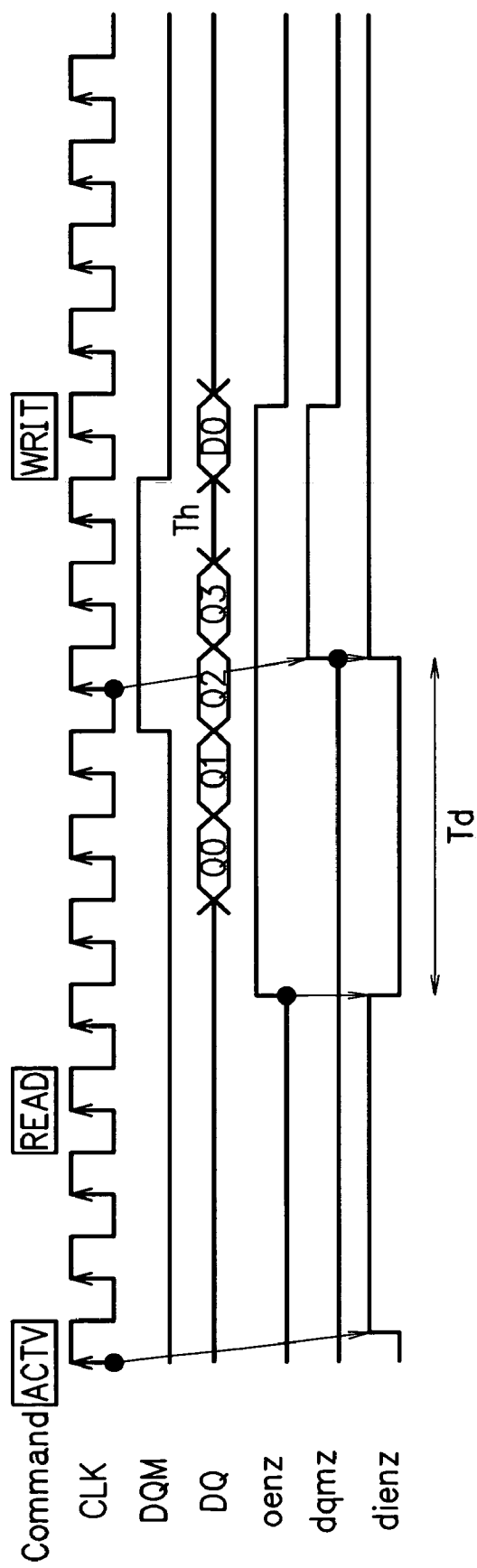
FIG. 7 is a timing chart showing an example of a writeinterrupt operation during a burst read of the circuit in FIG. 5.

FIG. 7 is a timing chart showing an example of the write interrupt operation during the burst read of the circuit in FIG. 5. When conducting this operation, the active command ACTV is inputted from outside, the read command READ is inputted thereafter, and after that, the write command WRIT is inputted. The description for the command, the clock signal CKL, the data mask DQM, the data DQ, the output enable signal "oenz", and the data mask signal "dqmz" is the same as of aforementioned FIG. 4. Hereinbelow, the description will be given for the activation signal "dienz".

Before being inputted the active command ACTV, the active bank signals "active_bankz <0>" to "active_bankz <3>" are all at low level, so that the activation signal "dienz" comes into low level. Backed by this, the input buffer 202 and the clock signal for latch "clkqz" (flip-flop 205) come into an inactive state, so that current consumption can be reduced.

Next, the active command ACTV is inputted from outside together with the bank address BA, then the active bank signal "active_bankz" corresponding to the bank address BA comes into high level, and since the output enable signal "oenz" is at low level as well, the activation signal "dienz" comes into high level.

Subsequently, when the read command READ is inputted, as in the case of the above-mentioned description for FIG. 4, the output enable signal "oenz" comes into high level. Then, both the data mask signals "dqmz <0>" and "dqmz <1>" are at low level. Accordingly, in the read period Td, the activation signal "dienz" comes into low level. In the read operation, the input buffer 202 and the flip-flop 205 are unnecessary, so that current consumption can be reduced by putting the input buffer 202 and the clock signal for latch "clkqz" (flip-flop 205) into an inactive state.

Subsequently, before inputting a next write command WRIT, the read data mask signals DQM <0> and DQM <1> are put into high level. The read data mask signals "dqmz <0>" and "dqmz <1>" come into high level in the same manner in synchronization with the following rising clock signal CLK. Then, the activation signal "dienz" comes into high level, and the input buffer 202 and the clock signal for latch "clkqz" (flip-flop 205) come into an active state. In the high-impedance period Th, the terminal for the data DQ comes into a high-impedance state in response to the high level of the data mask signals "dqmz <0>" and "dqmz <1>".

Subsequently, the write command WRIT is inputted from outside together with the write data D0. Since the input buffer 202 and the clock signal for latch "clkqz" (flip-flop 205) are at low level at that time, the write data D0 is buffered by the input buffer 202 to be latched by the flip-flop 205. After that, the write data D0 is written into a memory cell normally.

As describe above, in the read period Td, the input buffer 202 and the clock signal for latch "clkqz" (flip-flop 205) can be put into an inactive state, so that current consumption can be reduced. When inputting the write command WRIT, the activation signal "dienz" is at high level and the input buffer 202 and the clock signal for latch "clkqz" (flip-flop 205) are in an active state, allowing a normal write operation.

As has been describe in the above, in the present embodiment, when conducting a writeinterrupt operation during a burst read, for the purpose of preventing the contention caused by the input and output data DQ, a mask function of a read data using a read data mask signal DQM is employed. During a read operation, the input buffer 202 and the clock signal for latch "clkqz" (flip-flop 205) are put into an inactive state, however, when the mask function of the read data is used, the input buffer 202 and the clock signal for latch "clkqz" (flip-flop 205) are put back into an active state to prepare for the input of the write command WRIT.

Concretely, when all banks are in a precharge state, an activation signal "dienz" comes into low level, so that the input buffer 202 and the clock signal for latch "clkqz" (flip-flop 205) come into an inactive state. However, when any of the banks is in an active state, the activation signal "dienz" comes into high level, so that the input buffer 202 and the clock signal for latch "clkqz" (flip-flop 205) come into an active state. When it is in the read operation (the output enable signal "oenz" is at high level) even if any of the banks is in an active state, the activation signal comes into low level and the input buffer 202 and the clock signal for latch "clkqz" (flip-flop 205) come into an inactive state. Even if it is in the read operation (the output enable signal "oenz" is at high level), when the mask function of the read data is employed (the data mask signals "dqmz <0>" and "dqmz <1>" are at high level), the activation signal "dienz" comes into high level, so that the input buffer 202 and the clock signal for latch "clkqz" (flip-flop 205) come into an active state.

The input buffer 202 and the clock signal for latch "clkqz" (flip-flop 205) can be halted even in the state of a burst read without modifying the operation specification concerning a write data and the input timing of the write data while still supporting an operation of interrupting a burst read of a SDRAM with a write command, so that a SDRAM of a low current consumption can be provided without increasing burden on system designers.

In should be noted that any of the above-described embodiments are merely concrete examples to implement the present invention, and it is to be understood that the technical scope of the present invention will not be construed restrictive by these embodiments. In other words, the present invention can be realized in various forms without departing from the technological spirit and the main features thereof.

Current consumption can be reduced by putting into an inactive state during a read operation, and also, by putting into an active state corresponding to a read data mask signal, a write operation after the read operation can be conducted normally.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor memory device comprising:
   an input buffer being inputted a write data from outside to buffer the write data; and
   a control circuit putting said input buffer into an inactive state during a read operation outputting a read data to outside and putting said input buffer into an active state when a read data mask signal is inputted thereafter,
   wherein said control circuit puts said input buffer into an inactive state when an output enable signal in response to a read command is inputted.

2. The semiconductor memory device according to claim 1, further comprising a data terminal being inputted the write data from outside to output a read data outside,
   wherein the read data mask signal is a signal to put said data terminal into a high-impedance state.

3. The semiconductor memory device according to claim 2,
   wherein said input buffer buffers the write data inputted from outside together with a write command, after said data terminal comes into a high-impedance state.

4. The semiconductor memory device according to claim 1,
   wherein said control circuit puts said input buffer into an active state when an active command is inputted from outside.

5. The semiconductor memory device according to claim 4,
   wherein the active command is inputted together with a row address and the read command and the write command are inputted together with a column address.

6. The semiconductor memory device according to claim 5,
   wherein the active command, the read command, and the write command are inputted together with a bank address.

* * * * *